(12) United States Patent
Chung et al.

(10) Patent No.: US 7,851,864 B2
(45) Date of Patent: Dec. 14, 2010

(54) TEST STRUCTURE OF A SEMICONDUCTOR DEVICE AND SEMICONDUCTOR DEVICE

(75) Inventors: Se-Young Chung, Yongin-si (KR); Ji-Hae Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 224 days.

(21) Appl. No.: 12/175,492

(22) Filed: Jul. 18, 2008

(65) Prior Publication Data

US 2009/0020755 A1 Jan. 22, 2009

(30) Foreign Application Priority Data

Jul. 18, 2007 (KR) ...................... 10-2007-0071708

(51) Int. Cl.
*H01L 23/62* (2006.01)
(52) U.S. Cl. .................. 257/357; 257/48; 257/356; 257/E29.242
(58) Field of Classification Search ................ 257/355, 257/356, 357, E29.242
See application file for complete search history.

(56) References Cited

U.S. PATENT DOCUMENTS 6,465,848 B2 * 10/2002 Ker et al. ..................... 257/355
2003/0057476 A1 * 3/2003 Morita et al. ............... 257/327

FOREIGN PATENT DOCUMENTS

| JP | 11-345885 | 12/1999 |
| JP | 2001-110866 | 4/2001 |
| KR | 1020000046760 A | 7/2000 |
| KR | 1020000056067 A | 9/2000 |

* cited by examiner

*Primary Examiner*—Lex Malsawma
(74) *Attorney, Agent, or Firm*—Volentine & Whitt, PLLC

(57) ABSTRACT

A test structure includes a transistor, a dummy transistor and a pad unit. The transistor is formed on a first active region of a substrate. The dummy transistor is formed on a second active region of the substrate and electrically connected to the transistor. The pad unit is electrically connected to the transistor. Plasma damage to the transistor is reduced due to the presence of dummy transistor.

13 Claims, 11 Drawing Sheets

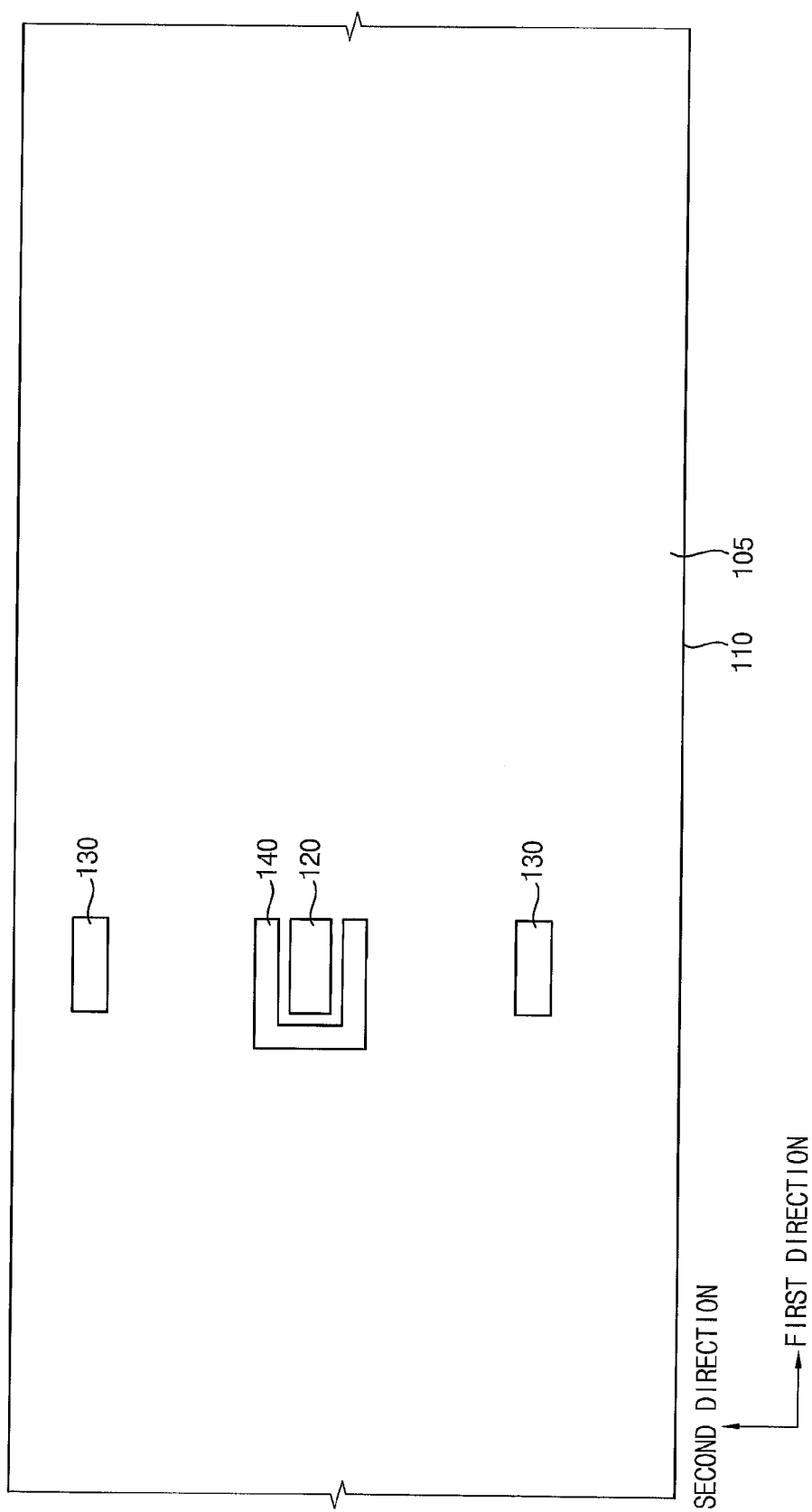

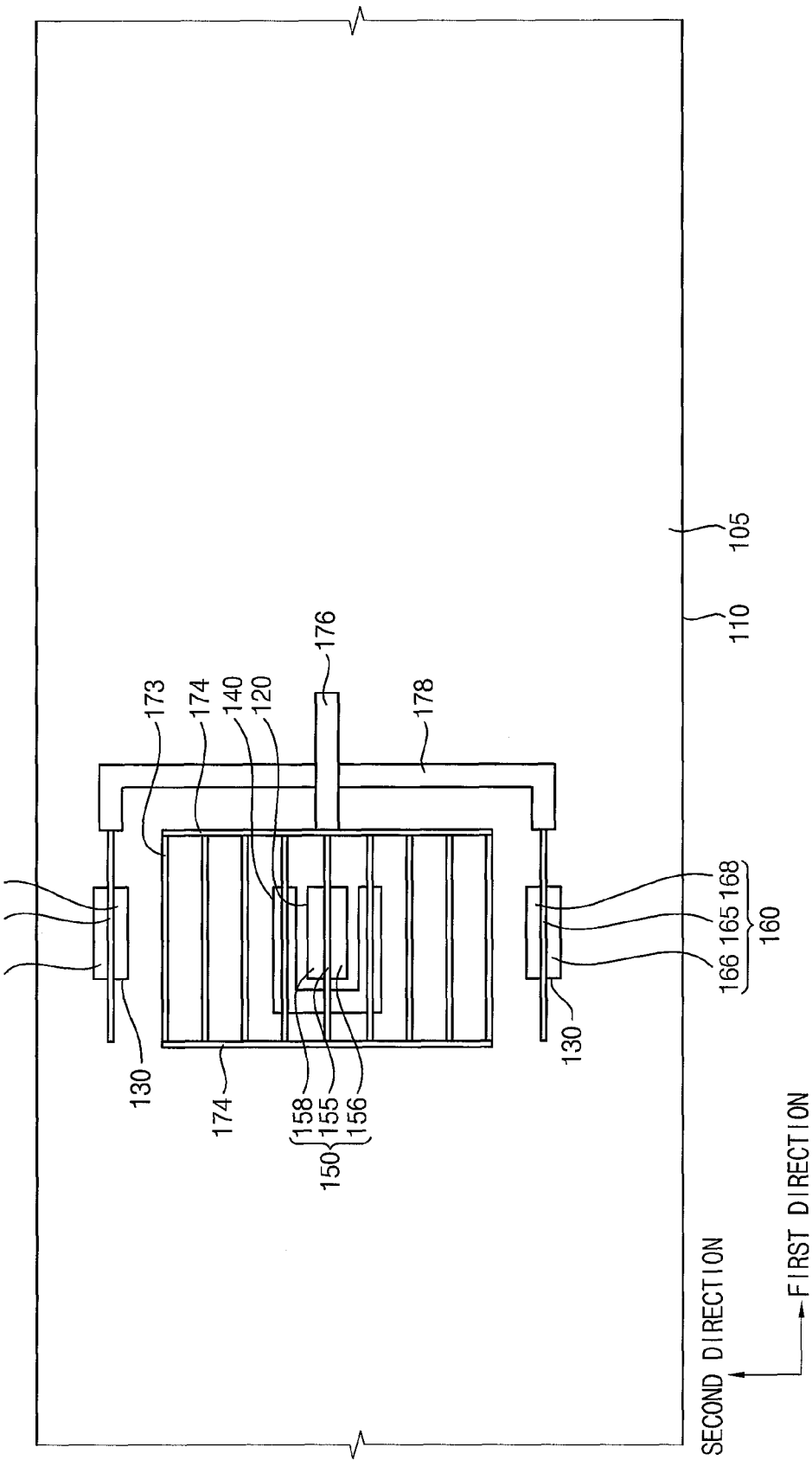

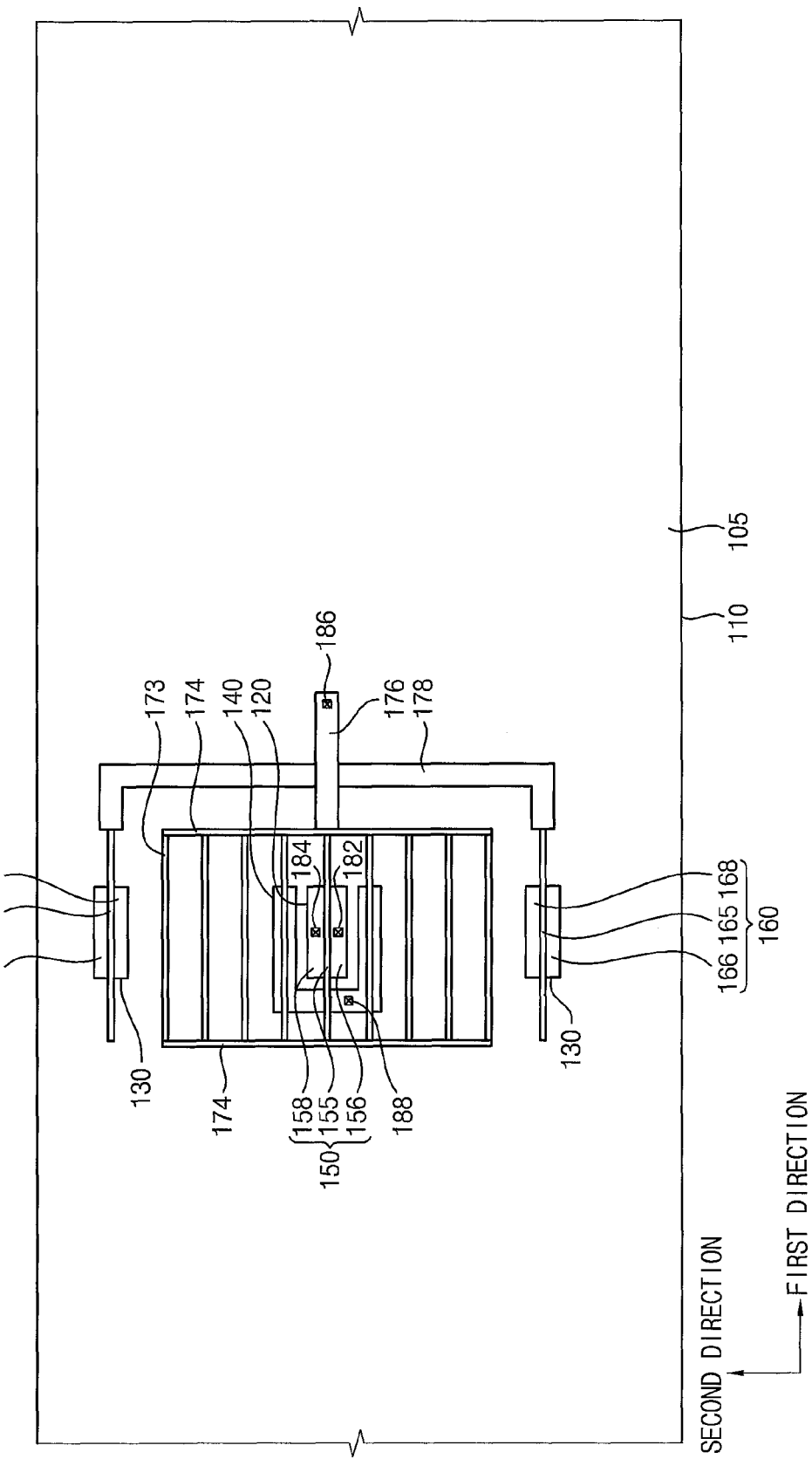

FIRST DIRECTION

SECOND DIRECTION

FIRST DIRECTION
SECOND DIRECTION

TEST STRUCTURE OF A SEMICONDUCTOR DEVICE AND SEMICONDUCTOR DEVICE

PRIORITY STATEMENT

A claim of priority under 35 USC §119 is made to Korean Patent Application No. 2007-71708, filed Jul. 18, 2007, in the Korean Intellectual Property Office (KIPO), the contents of which are herein incorporated by reference in their entirety.

SUMMARY

Example embodiments of the present invention relate to a test structure, a method of forming the same, a semiconductor device and a method of manufacturing the same. More particularly, example embodiments of the present invention relate to a test structure including a dummy transistor, a method of forming the same, a semiconductor device including a dummy transistor and a method of manufacturing the same.

Photolithography processes are utilized in the fabrication of semiconductor devices. Generally, photolithography includes etching processes such as a plasma etching processes and a reactive ion etching (RIE) processes. When high density plasma is produced during photolithography, a strong magnetic filed is generated between a substrate and a gate structure, and thus a gate insulation layer in the gate structure may be seriously damaged.

In the meantime, in order to estimate various electrical characteristics (e.g., threshold voltage, transconductance, and leakage current) of a semiconductor device, test structures such as a test element group (TEG) pattern are formed in a scribe lane region of a substrate on which the semiconductor device is formed. The TEG pattern is formed utilizing plasma etching, and thus a gate insulation layer in the TEG pattern may be damaged. This can result in inaccurate measure of device electrical characteristics.

Example embodiments of the present invention provide a test structure having a layout in which plasma damage thereto is reduced during a plasma etching process.

Example embodiments of the present invention provide a method of forming a test structure having a layout in which plasma damage thereto is reduced during a plasma etching process.

Example embodiments of the present invention provide a semiconductor device having a layout in which plasma damage thereto is reduced during a plasma etching process.

Example embodiments of the present invention provide a method of manufacturing a semiconductor device having a layout in which plasma damage thereto is reduced during a plasma etching process.

According to one aspect of the present invention, there is provided a test structure of a semiconductor device. The test structure includes a transistor, a dummy transistor and a pad unit. The transistor is formed on a first active region of a substrate. The dummy transistor is formed on a second active region of the substrate and electrically connected to the transistor. The pad unit is electrically connected to the transistor.

According to another aspect of the present invention, there is provided a method of forming a test structure of a semiconductor device. In the method of forming the test structure, first and second active regions are formed in a substrate. A transistor is formed on the first active region, and a dummy transistor is formed on the second active region and electrically connected to the transistor. A pad unit is formed to be electrically connected to the transistor.

According to still another aspect of the present invention, there is provided a semiconductor device. The semiconductor device includes a transistor and a dummy transistor. The transistor is formed on a first active region of a substrate. The dummy transistor is formed on a second active region and electrically connected to the transistor.

According to still another aspect of the present invention, there is provided a method of manufacturing a semiconductor device. In the method of manufacturing the semiconductor device, first and second active regions are formed at a substrate. A transistor is formed on the first active region, and a dummy transistor is formed on the second active region and electrically connected to the transistor.

BRIEF DESCRIPTION OF THE DRAWINGS

The above and other features and advantages of the present invention will become readily apparent from the detail description of embodiments that follows, with reference to the accompanying drawings, in which:

FIGS. 4A to 4D are top views for use in describing a method of forming a test structure of a semiconductor device in accordance with some example embodiments of the present invention;

DETAILED DESCRIPTION OF EMBODIMENTS

Figure 1:
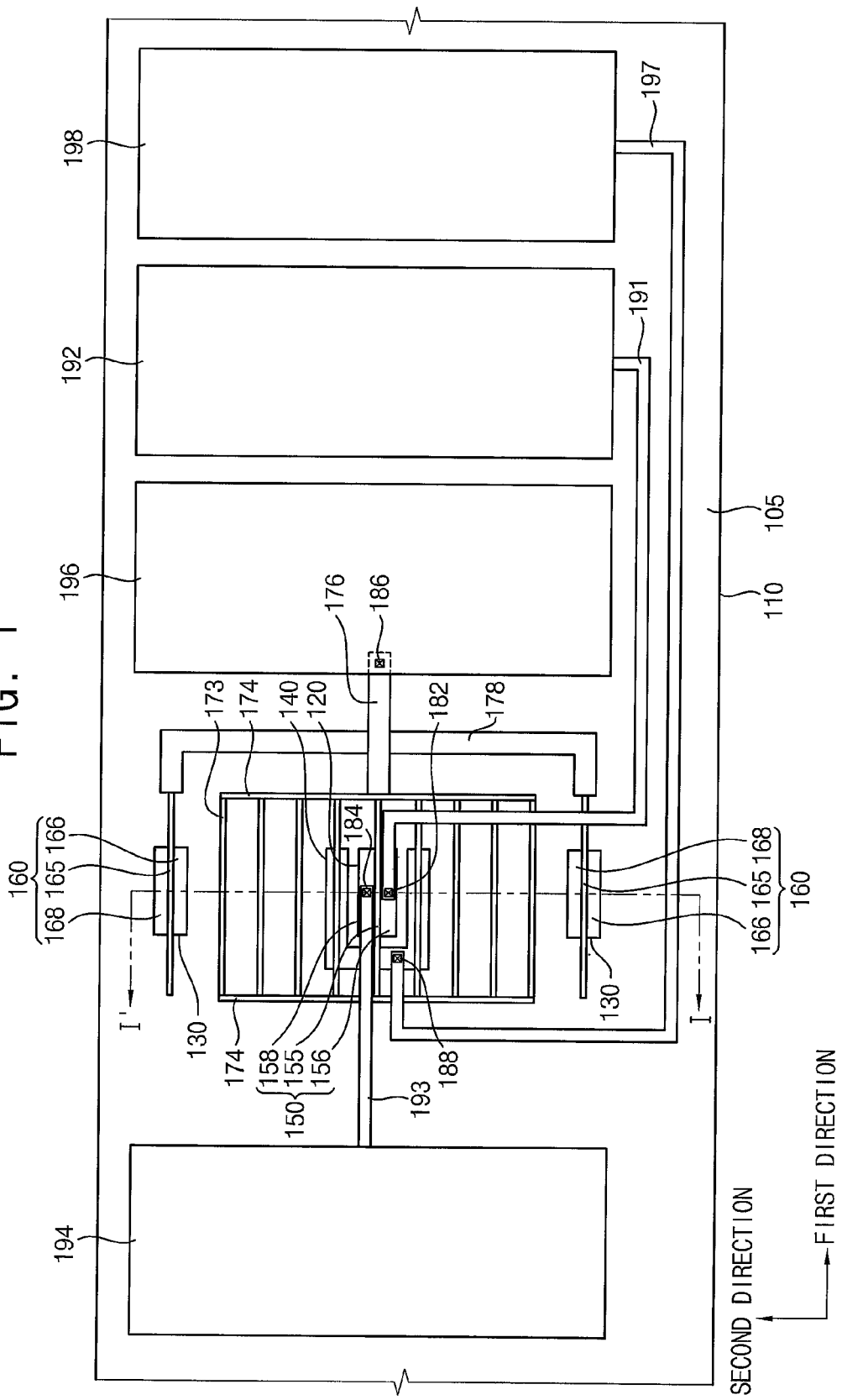
FIG. 1 is a top view illustrating a test structure in accordance with some example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 2:
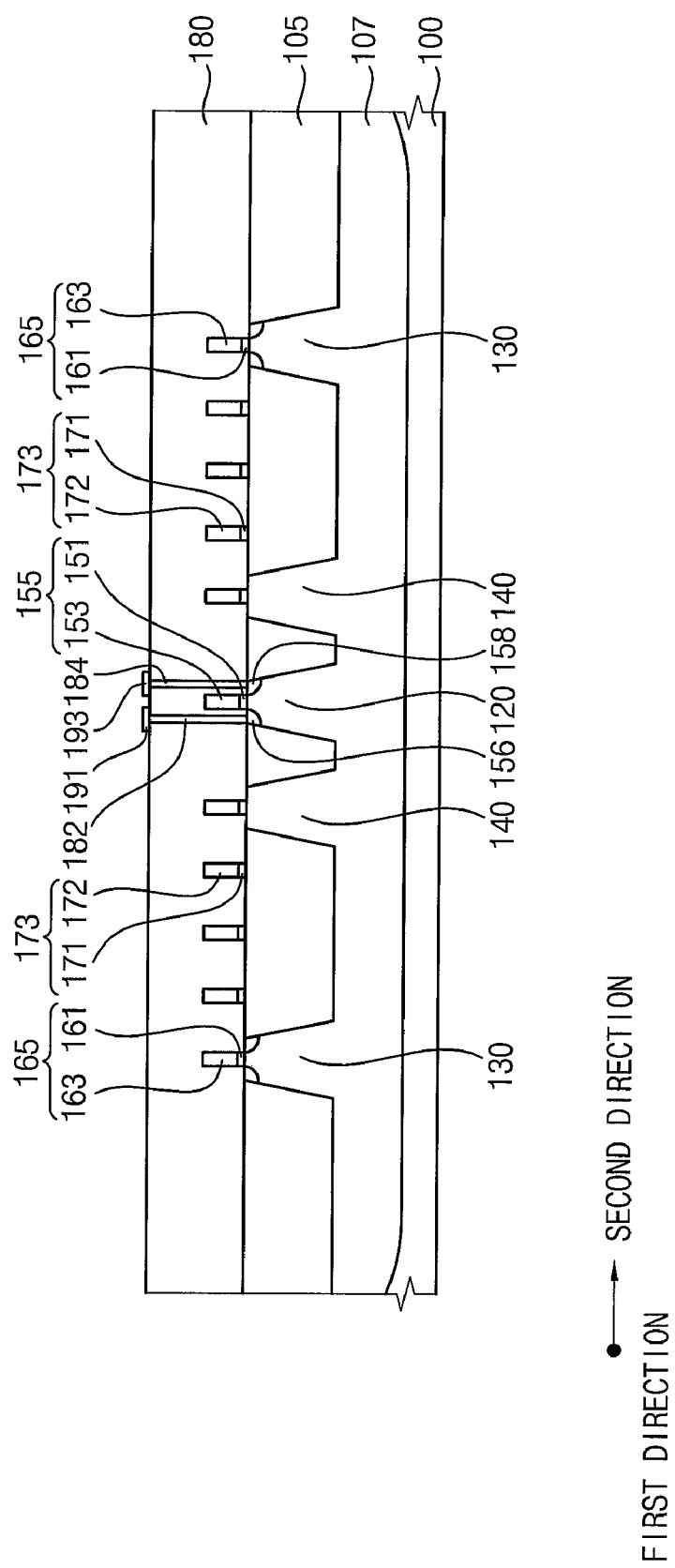
FIG. 2 is a cross-sectional view taken along the line I-I' of FIG. 2.

FIG. 1 is a top view illustrating a test structure in accordance with some example embodiments of the present invention, and FIG. 2 is a cross-sectional view taken along the line I-I' of FIG. 1.

Referring to FIGS. 1 and 2, a test structure of a semiconductor device includes a transistor 150 on a scribe lane region of a substrate 100, a dummy transistor 160 and a pad unit. The test structure may further include a plurality of second gate lines 173.

The substrate 100 may include, as non-limiting examples, a semiconductor substrate on which semiconductor devices are formed, or a glass substrate on which integrated circuits for a flat panel display device are formed. Specific examples of substrate 100 also include a silicon substrate, a germanium substrate, a silicon-germanium substrate, a silicon-on-insulator (SOI) substrate, and a germanium-on-insulator (GOI) substrate. The substrate 100 may be divided into net die regions (not shown) and a scribe lane region 110. Various circuit patterns may be formed on the net die regions, and the test structure may be formed on the scribe lane region 110 between the net die regions. An alignment pattern and an overlay pattern may be further formed on the scribe lane region 110.

The substrate 100 may be also divided into a field region in which an isolation layer 105 is formed and an active region. The isolation layer 105 may include silicon oxide. The active region of this example is defined by a first active region 120, a second active region 130 and a third active region 140.

The transistor 150 includes a first gate line 155 on the first active region 120 and a first source region 156 and a first drain region 158 at upper portions of the first active region 120 adjacent to the first gate line 155.

The first gate line 155 includes a first gate insulation layer 151 and a first gate electrode 153. The first gate insulation layer 151 may include silicon oxide or a metal oxide, and the first gate electrode 153 may include polysilicon doped with impurities, a metal and/or a metal silicide. Gate spacers (not shown) including silicon nitride or silicon oxynitride may be formed on sidewalls of the first gate line 155. In an example embodiment of the present invention, the first gate line 155 extends in a first direction and may be formed even at an outside area of the first active region 120.

The first source and drain regions 156 and 158 may include P-type impurities such as boron, gallium, indium, and so on, or N-type impurities such as phosphorus, arsenic, antimony, and so on.

The transistor 150 may have a configuration which is substantially the same as or similar to that of a cell transistor on the net die regions. The characteristics (e.g., threshold voltage) of the cell transistor may be measured by measuring the characteristics of the transistor 150.

Although one transistor 150 is shown in FIGS. 1 and 2, a plurality of transistors 150 may be also formed. Additionally, the transistor 150 may be formed at any area between the second gate lines 173, and even at an outside area of the second gate lines 173.

Each of the second gate lines 173 includes a second gate insulation layer 171 and a second gate electrode 172. The second gate insulation layer 171 and the second gate electrode 172 may include materials substantially the same as those of the first gate insulation layer 151 and the first gate electrode 153, respectively. Gate spacers (not shown) may be further formed on sidewalls of the second gate lines 173. The second gate lines 173 may be formed to have a layout which is substantially the same as that of gate lines on the net die regions. In an example embodiment of the present invention, each of the second gate lines 173 extends in the first direction, and the second gate lines 173 are disposed in a second direction substantially perpendicular to the first direction.

The second gate lines 173 may be connected to each other by a first conductive line 174 extending in the second direction. The first gate line 155 may be also connected to the second gate lines 173 by the first conductive line 174. The first conductive line 174 may include a material which is substantially the same as those of the first and second gate lines 155 and 173. Even though the first conductive line 174 is formed at both ends of the second gate lines 173 extending in the second direction in FIG. 1, the first conductive line 174 may instead be formed only at one end of the second gate lines 173, or formation of the first conductive line 174 may be omitted.

The dummy transistor 160 includes a dummy gate line 165 on the second active region 130, and a second source region 166 and a second drain region 168 at upper portions of the second active region 130 adjacent to the dummy gate line 165.

The dummy gate line 165 includes a dummy gate insulation layer 161 and a dummy gate electrode 163. The dummy gate insulation layer 161 and the dummy gate electrode 163 may include materials which are substantially the same as those of the first gate insulation layer 151 and the first gate electrode 153, respectively. Gate spacers (not shown) may be further formed on sidewalls of the dummy gate lines 165. In an example embodiment of the present invention, the dummy gate line 165 extends in the first direction, and may be formed even at an outside area of the second active region 130.

The second source and drain regions 166 and 168 may include a material which is substantially the same as that of the first source and drain regions 156 and 158.

The dummy transistor 160 may have a structure which is substantially the same as or similar to that of the transistor 150. However, the dummy transistor 160 is not connected to a source pad 192, a drain pad 194 or a bulk pad 198. That is, the transistor 150 is electrically connected to the source pad 192, the drain pad 194 and the bulk pad 198, and thus electrical signals are applied thereto. However, electrical signals are not applied to the dummy transistor 160, and thus the characteristics (e.g., threshold voltage) of the dummy transistor 160 are not measured.

Even though two dummy transistors 160 are shown in FIGS. 1 and 2, only one dummy transistor 160 or more than two dummy transistors 160 may be formed. Alternatively, more than one dummy gate line 165 may be formed on one second active region 130, and thus a plurality of the dummy transistors 160 each of which includes one dummy gate line 165 may be formed. Furthermore, the dummy transistor 160 may be formed at an outside area of the second gate lines 173, or at any area between the second gate lines 173.

The dummy transistor 160 is electrically connected to the transistor 150. In an example embodiment of the present invention, the dummy gate line 165 is electrically connected to the first gate line 155. In FIG. 1, the dummy gate line 165 and the first gate line 155 are electrically connected to each other by the first conductive line 174, a second conductive line 176 and a third conductive line 178. The second and third conductive lines 176 and 178 may include a material which is substantially the same as that of the first conductive line 174.

Accordingly, plasma used in successive processes do damage not only to the transistor 150 but also to the dummy transistor 160, and thus plasma damages to the transistor 150 may be dispersed into the dummy transistor 160 and relatively reduced.

The pad unit of this example includes the source pad 192, the drain pad 194, a gate pad 196 and the bulk pad 198. The pads 192, 194, 196 and 198 may include a conductive material such as a metal and/or a metal nitride. The pads 192, 194, 196 and 198 are formed on an insulating interlayer 180.

The insulating interlayer 180 is formed on the substrate 100 to cover the transistor 150, the dummy transistor 160, the second gate lines 173 and the first to third conductive lines 174, 176 and 178. The insulating interlayer 180 may include an oxide, a nitride and/or an oxynitride.

The source pad 192 is electrically connected to the first source region 156 by a source pad connection line 191 on the insulating interlayer 180 and a first plug 182 through the insulating interlayer 180. The drain pad 194 is electrically connected to the first drain region 158 by a drain pad connection line 193 on the insulating interlayer 180 and a second plug 184 through the insulating interlayer 180. The gate pad 196 is electrically connected to the second conductive line 176 by a third plug 186, and thus is connected to the first gate line 155. The bulk pad 198 is electrically connected to the third active region 140 by a bulk pad connection line 197 on the insulating interlayer 180 and a fourth plug 188 through the insulating interlayer 180. Each of the connection lines 191, 193 and 197 and each of the plugs 182, 184, 186 and 188 may include a metal and/or a metal nitride.

The third active region 140 is formed at a portion of the scribe lane region 110. In an example embodiment of the present invention, the third active region 140 is formed at a peripheral area of the first active region 120. The third active region 140 may serve as a path by which electrical signals pass, and the electrical signals are applied to a well region 107 formed at a portion of the substrate 100. That is, electrical signals applied to the bulk pad 198 may pass by the bulk pad connection line 197, the fourth plug 188 and the third active region 140, and may be applied to the well region 107. The well region 107 may include P-type or N-type impurities.

The order and the locations of the pads 192, 194, 196 and 198 may be changed. Further, additional components such as bit lines, capacitors, and/or wirings may be further formed on the substrate 100.

The test structure of the semiconductor device in accordance with some example embodiments of the present invention includes not only the transistor 150, through which the characteristics of elements formed in the net die regions may be presumed by measuring the characteristics thereof such as the threshold voltage, but also the dummy transistor 160. Thus, during an etching process using plasma, plasma damage to the first gate line 155 of the transistor 150 may be dispersed into the dummy gate line 165 of the dummy transistor 160, and thus the plasma damage to the first gate line 155 may be relatively reduced. Accordingly, the characteristics of the transistor 150, such the threshold voltage, may be measured more exactly.

In FIGS. 1 and 2, the test structure of the semiconductor device is formed on the scribe lane region 110. However, the test structure may be also formed on the net die regions. In this case, any test structure of a semiconductor device having the features of the above embodiments may be included in the scope of the present invention.

Figure 3:
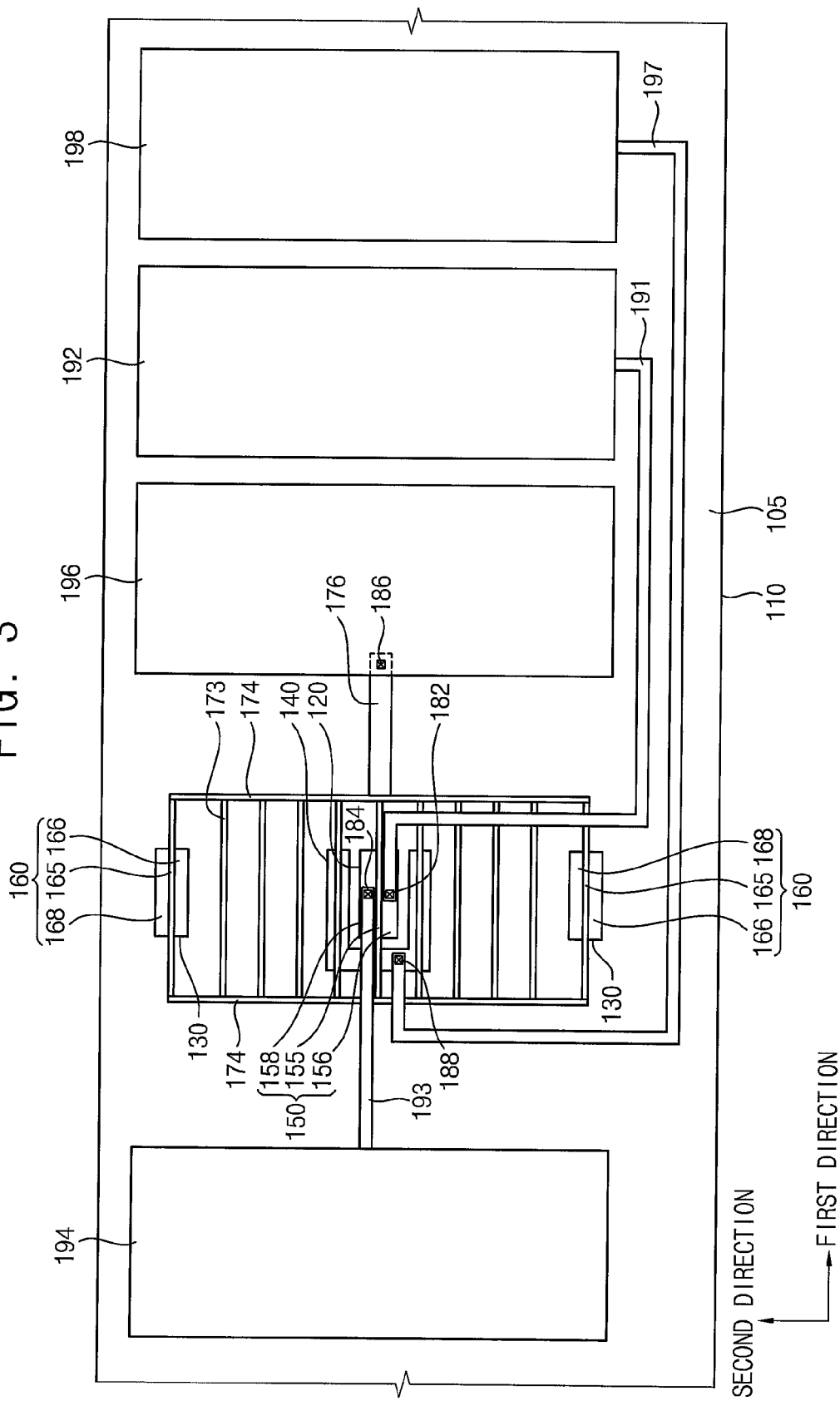
FIG. 3 is a top view illustrating a test structure of a semiconductor device in accordance with other example embodiments of the present invention.

FIG. 3 is a top view illustrating a test structure of a semiconductor device in accordance with other example embodiments of the present invention. The test structure in FIG. 3 is substantially the same as or similar to that of FIG. 1, except that the third conductive line 178 is omitted. Thus, like numerals refer to like elements, and repetitive explanations are omitted below to avoid redundancy.

Referring to FIG. 3, the dummy gate line 165 of the dummy transistor 160 is connected to the first gate line 155 of the transistor 150 by the first conductive line 174. The dummy gate line 165 is also connected to the second gate lines 173. In this case, one or more than one first conductive lines 174 are formed. Any case in which the dummy transistor 160 is electrically connected to the transistor 150 may be included in the scope of the present embodiments, including the case where only the first conductive line 174 electrically connects the dummy gate line 165 to the first gate line 155. For example, when the first gate line 155, the dummy gate line 165 and the second gate lines 173 are disposed sequentially in the second direction, the first conductive line 174 may be formed at one or both ends of the first gate line 155 and the dummy gate line 165, and may not be formed at one or both ends of the second gate lines 173.

FIGS. 4A to 4D are top views for use in describing a method of forming a test structure of a semiconductor device in accordance with some example embodiments of the present invention. Although a method of forming the test structure of FIG. 1 is illustrated in FIGS. 4A to 4D, the scope of the present embodiments is not limited to the method of forming the test structure of FIG. 1.

Referring to FIG. 4A, an isolation layer 105 is formed at a scribe lane region 110 of a substrate (not shown) to define a first active region 120, second active regions 130 and a third active region 140. The isolation layer 105 may be formed by a shallow trench isolation (STI) process or a local oxidation of silicon (LOCOS) process. An ion implantation process is performed on the substrate to form a well region 107 (see FIG. 2) at the scribe lane region 110.

Although only one first active region 120 is shown in FIG. 4A, a plurality of the first active regions 120 may be formed. Additionally, two second active regions 130 are shown in FIG. 4A. However, one or more than two second active regions 130 may be formed. The third active region 140 has a "C" shape in FIG. 4A. However, the third active region 140 may have any other shape.

Referring to FIG. 4B, a transistor 150 and a dummy transistor 160 are formed on the first active region 120 and the second active region 130, respectively. A plurality of second gate lines 173 and first to third conductive lines 174, 176 and 178 are formed.

In particular, an insulation layer (not shown) is formed on the scribe lane region 110. The insulation layer may be formed using an oxide, a nitride and/or an oxynitride. As examples, the insulation layer may be formed by a chemical vapor deposition (CVD) process, a low pressure chemical vapor deposition (LPCVD) process, a plasma enhanced chemical vapor deposition (PECVD) process, or a high density plasma chemical vapor deposition (HDP-CVD) process.

A first conductive layer is formed on the insulation layer using doped polysilicon, a metal and/or a metal silicide. As examples, the first conductive layer may be formed by a CVD process, an atomic layer deposition (ALD) process, or an HDP-CVD process.

A photoresist pattern (not shown) is formed on the first conductive layer, and the first conductive layer and the insulation layer are partially removed by an etching process using the photoresist pattern as an etching mask to form a first gate line 155, a dummy gate line 165, a second gate line 173 and the first to third conductive lines 174, 176 and 178. The first gate line 155 includes a first gate insulation layer 151 (see FIG. 2) and a first gate electrode 153 (see FIG. 2), and the dummy gate line 165 includes a dummy gate insulation layer 161 (see FIG. 2) and the dummy gate electrode 163 (see FIG. 2), and the second gate line 173 includes a second gate insulation layer 171 (See FIG. 2) and a second gate electrode 172 (see FIG. 2).

Impurities are implanted onto the first and second active regions 120 and 130 by an ion implantation process. Thus, a first source region 156 and a first drain region 158 are formed at upper portions of the first active region 120 adjacent to the first gate line 155, and a second source region 166 and a second drain region 168 are formed at upper portions of the second active region 130 adjacent to the dummy gate line 165. The first gate line 155, the first source region 156 and the first drain region 158 constitute the transistor 150, and the dummy gate line 165, the second source region 166 and the second drain region 168 constitute the dummy transistor 160.

In an example embodiment of the present invention, each of the first gate line 155, the dummy gate line 165 and the second gate lines 173 is formed to extend in a first direction. Additionally, the first gate line 165 and the second gate lines 173 are electrically connected to each other by the first conductive line 174 extending in a second direction which is substantially perpendicular to the first direction. The first gate line 155 and the dummy gate line 165 are electrically connected to each other by the second and third conductive lines 176 and 178.

Referring to FIG. 4C, an insulating interlayer 180 (see FIG. 2) is formed on the scribe lane region 110 to cover the transistor 150, the dummy transistor 160, the second gate lines 173 and the first to third conductive lines 174, 176 and 178. The insulating interlayer may be formed using an oxide, a nitride and/or an oxynitride. As examples, the insulating interlayer may be formed using a CVD process, an LPCVD process, a PECVD process, or an HDP-CVD process.

A first plug 182, a second plug 184, a third plug 186 and a fourth plug 188 are formed through the insulating interlayer 180 on the first source region 156, the first drain region 158, the second conductive line 176 and the third active region 140, respectively.

In particular, openings (not shown) are formed through the insulating interlayer 180 to partially expose the first source region 156, the first drain region 158, the second conductive line 176 and the third active region 140. A second conductive layer is formed on the insulating interlayer 180 to fill up the openings. As examples, the second conductive layer may be formed by a CVD process, an ALD process, or an HDP-CVD process, using a metal and/or a metal nitride. An upper portion of the second conductive layer on the insulating interlayer 180 is removed by a chemical mechanical polishing (CMP) process and/or an etch-back process, thereby forming the first to fourth plugs 182, 184, 186 and 188 electrically connected to the first source region 156, the first drain region 158, the second conductive line 176 and the third active region 140, respectively.

Figure 4D:
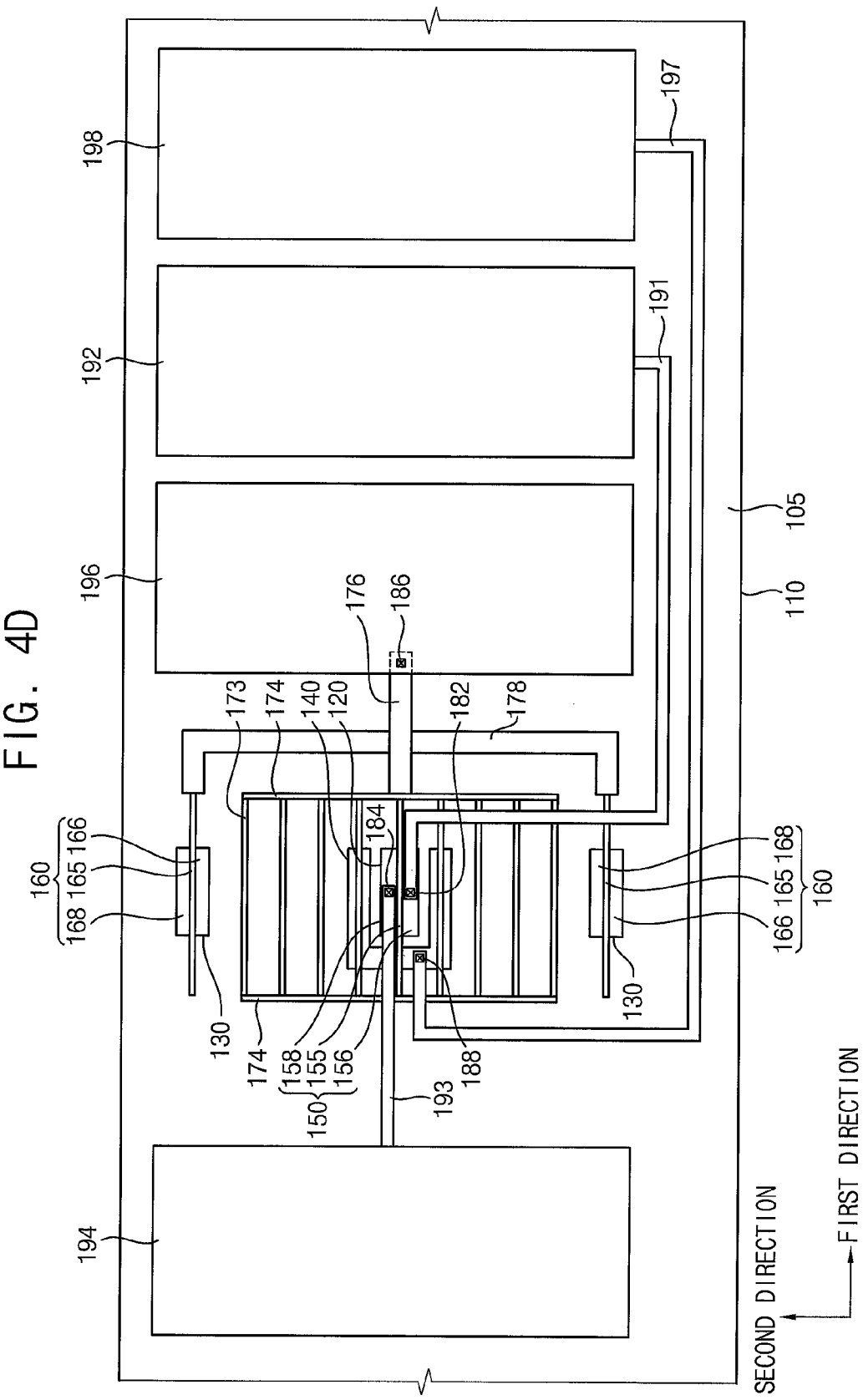

Referring to FIG. 4D, a source pad 192, a drain pad 194, a gate pad 196 and a bulk pad 198 are formed to be electrically connected to the first source region 156, the first drain region 158, the first gate line 165 and the third active region 140, respectively.

In particular, a third conductive layer is formed on the insulating interlayer 180 and the first to fourth plugs 182, 184, 186 and 188. As examples, the third conductive layer may be formed by a CVD process, an ALD process, or an HDP-CVD process, using a metal and/or a metal nitride. The third conductive-layer is patterned by a photolithography process using a photoresist pattern to form the gate pad 196 electrically connected to the third plug 186, and the source pad 192, the drain pad 194 and the bulk pad 198 are formed to be spaced from the gate pad 196 at a predetermined distance in the first direction. In this case, the locations of the source pad 192, the drain pad 194 and the bulk pad 198 may be changed. Additionally, a source pad connection line 191, which electrically connects the source pad 192 to the first plug 182, a drain pad connection line 193, which electrically connects the drain pad 194 to the second plug 184, and a bulk pad connection line 197, which electrically connects the bulk pad 198 to the fourth plug 188, are formed. Accordingly, the source pad 192, the drain pad 194, the gate pad 196 and the bulk pad 198 may be electrically connected to the first source region 156, the first drain region 158, the first gate line 165 and the third active region 140, respectively, and the bulk pad 198 may be electrically connected to the well region 107 by the third active region 140.

The test structure of the semiconductor device may be formed by the above processes. In addition, other elements or patterns may be formed, such as bit lines, capacitors, and/or wirings. Plasma damage to the transistor 150 generated in formation of the above patterns or elements may be dispersed into the dummy transistor 160, and thus plasma damages to the transistor 150 may be reduced.

Figure 5:
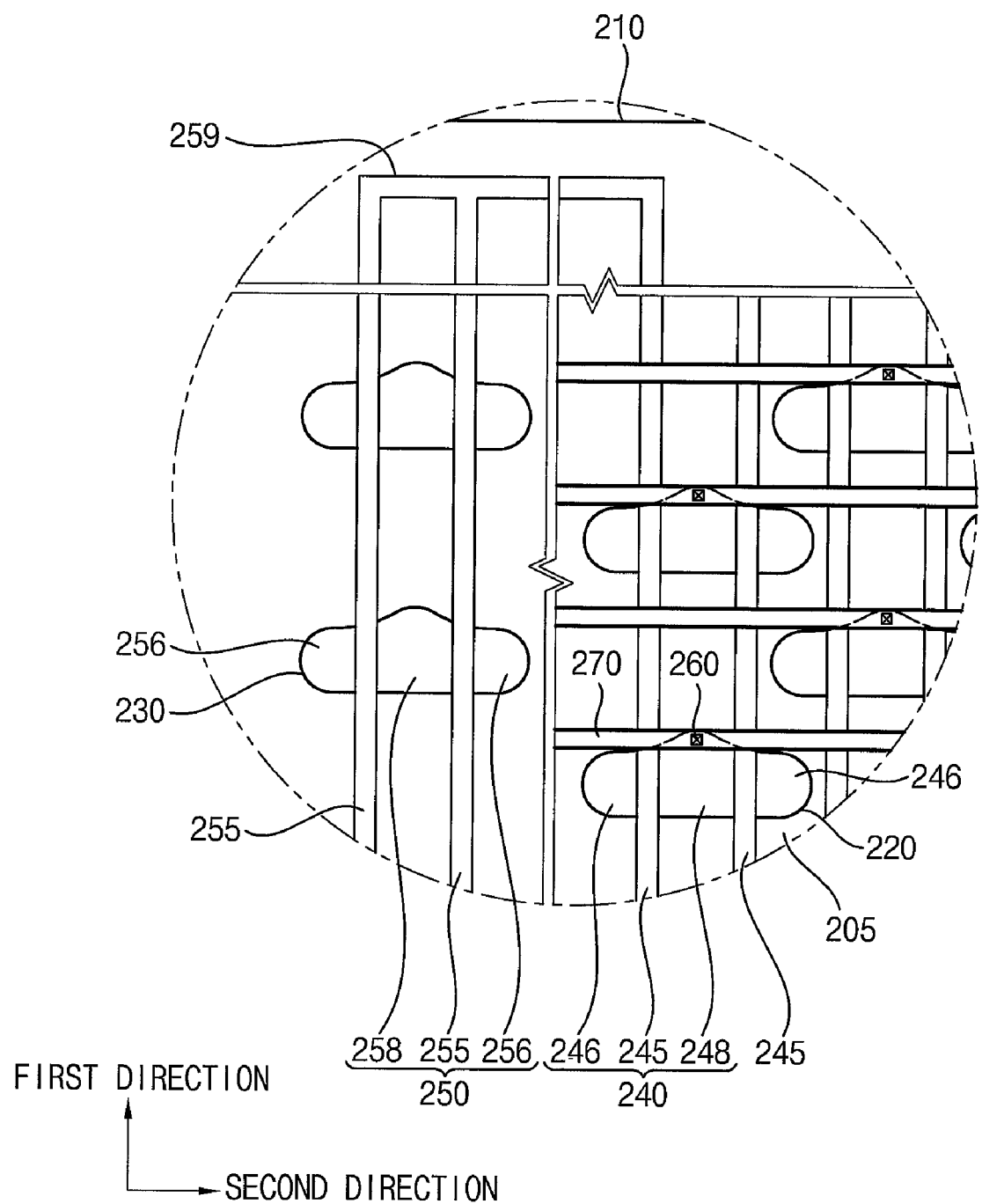
FIG. 5 is a top view illustrating a semiconductor device in accordance with some example embodiments of the present invention.

FIG. 5 is a top view illustrating a semiconductor device in accordance with some example embodiments of the present invention.

Referring to FIG. 5, the semiconductor device includes a transistor 240 and a dummy transistor 250 on net die regions 210 of a substrate (not shown).

Examples of the substrate include a silicon substrate, a germanium substrate, a silicon-germanium substrate, a SOI substrate, and a GOI substrate. The substrate may be divided into the net die regions 210 and a scribe lane region (not shown) between the net die regions 210. Various circuit patterns are formed on the net die regions 210, and various test structures, align patterns, and overlay patterns may be formed on the scribe lane region.

The substrate may be also divided into a field region at which an isolation layer 205 is formed, and an active region. The isolation layer 205 may include silicon oxide. The active region includes a first active region 220 and a second active region 230. In an example embodiment of the present invention, a plurality of the first active regions 220 is formed in the substrate to constitute an active region array. One or more than one second active regions 230 may be formed.

The transistor 240 includes a gate line 245 on the first active region 220, a first source region 246 and a first drain region 248 at upper portions of the first active region 220 adjacent to the gate line 245.

The gate line 245 includes a gate insulation layer (not shown) and a gate electrode (not shown). The gate insulation layer may include silicon oxide or a metal oxide, and the gate electrode may include doped polysilicon, a metal and/or a metal nitride. Gate spacers (not shown) including silicon nitride or silicon oxynitride may be further formed on sidewalls of the gate line 245.

In an example embodiment of the present invention, the gate line 245 extends in a first direction, and one gate line 245 may be formed on a plurality of the first active regions 220. Additionally, a plurality of the gate lines 245 may be formed, and the gate lines 245 may be disposed at a given distance from each other in a second direction which is substantially perpendicular to the first direction. In an example embodiment of the present invention, two gate lines 245 are formed on one first active region 220.

The first source and drain regions 246 and 248 may include P-type impurities such as boron, gallium, indium, and so on, or N-type impurities such as phosphorus, arsenic, antimony, and so on. The locations of the first source and drain regions 246 and 248 may be changed.

The dummy transistor 250 includes a dummy gate line 255 on the second active region 230, and a second source region 256 and a second drain region 258 at upper portions of the second active region 230 adjacent to the dummy gate line 255.

The dummy gate line 255 includes a dummy gate insulation layer (not shown) and a dummy gate electrode (not shown). The dummy gate insulation layer and the dummy gate electrode may include materials which are substantially the same as those of the gate insulation layer and the gate electrode, respectively. Gate spacers (not shown) may be further formed on sidewalls of the dummy gate line 255.

In an example embodiment of the present invention, the dummy gate line 255 extends in the first direction, and one dummy gate line 255 is formed on one or more than one second active region 230. In an example embodiment of the present invention, a plurality of the dummy gate lines 255 is formed, and the dummy gate lines 255 are disposed at a given distance from each other in a second direction which is substantially perpendicular to the first direction. The dummy gate lines 255 may be electrically connected to each other by a conductive line 259. In an example embodiment of the present invention, two dummy gate lines 255 are formed on one second active region 230.

The dummy gate line 255 is electrically connected to the gate line 245. In an example embodiment of the present invention, the dummy gate line 255 is electrically connected to the gate line 245 by the conductive line 259 extending in the second direction. The conductive line 259 may include a material which is substantially the same as that of the gate line 245 and the dummy gate line 255.

The second source and drain regions 256 and 258 may include impurities which are substantially the same as those of the first source and drain regions 246 and 248.

The dummy transistor 250 may have a structure which is substantially the same as or similar to that of the transistor 240. However, the dummy transistor is not electrically connected to a bit line 270. That is, the dummy transistor 250 is not electrically connected to the bit line 270, and thus electrical signals are not applied to the dummy transistor 250.

However, the dummy gate line 255 is electrically connected to the gate line 245, so that plasma used in successive processes do damage not only to the transistor 240 but also to the dummy transistor 250. As a result, damages to the transistor 240 may be dispersed into the dummy transistor 250 and relatively reduced.

An insulating interlayer (not shown) is formed on the substrate to cover the transistor 240, the dummy transistor 250 and the conductive line 259. The insulating interlayer may include an oxide, a nitride and/or an oxynitride.

The bit line 270 is electrically connected to the first drain region 248 by a plug 260 through the insulating interlayer. The bit line 270 may include a conductive material such as a metal and/or a metal nitride.

Capacitors (not shown) may be further formed over the bit line 270 and the insulating interlayer to be electrically connected to the first source region 246, and other wirings and elements may be also formed.

The semiconductor device includes not only the transistor 240 serving as a switching element, but also the dummy transistor 250. Thus, plasma damage to the transistor 240 generated in formation of the above patterns or elements may be dispersed into the dummy transistor 250, and thus plasma damage to the transistor 240 may be reduced. As a result, the semiconductor device may exhibit favorable reliability and favorable electrical characteristics.

Figure 6A:
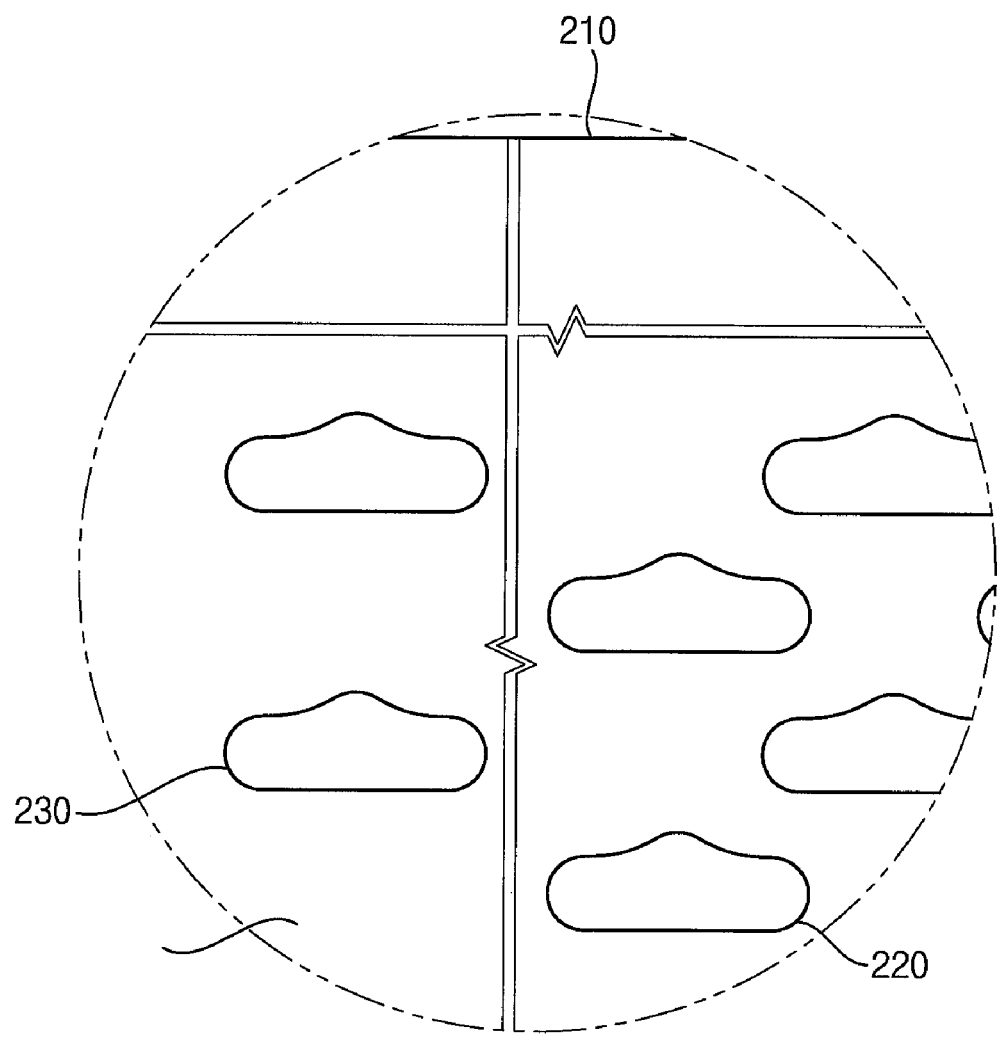
FIGS. 6A to 6C are top views for use in explaining a method of manufacturing a semiconductor device in accordance with some example embodiments of the present invention.
Figure 6B:
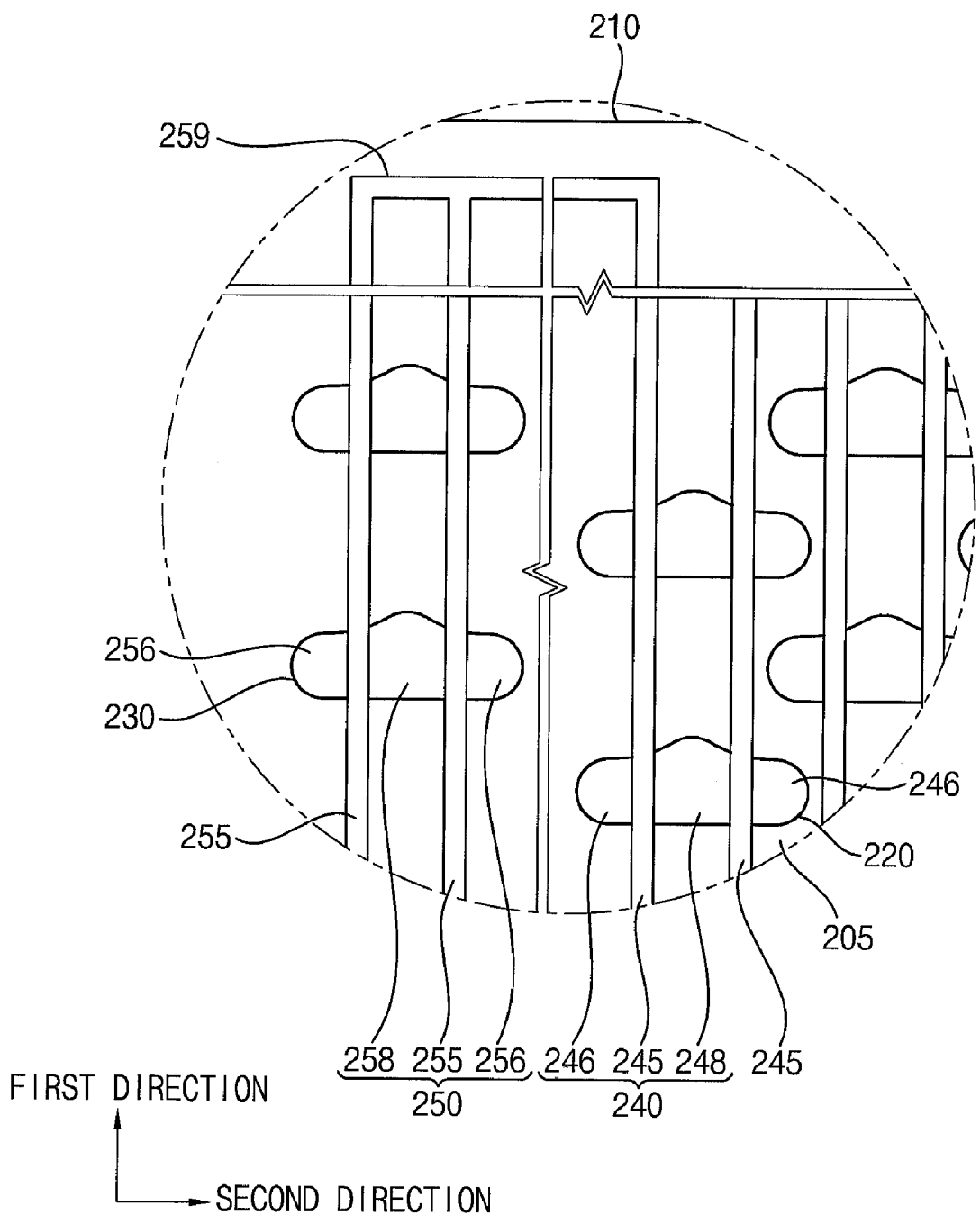
Figure 6C:
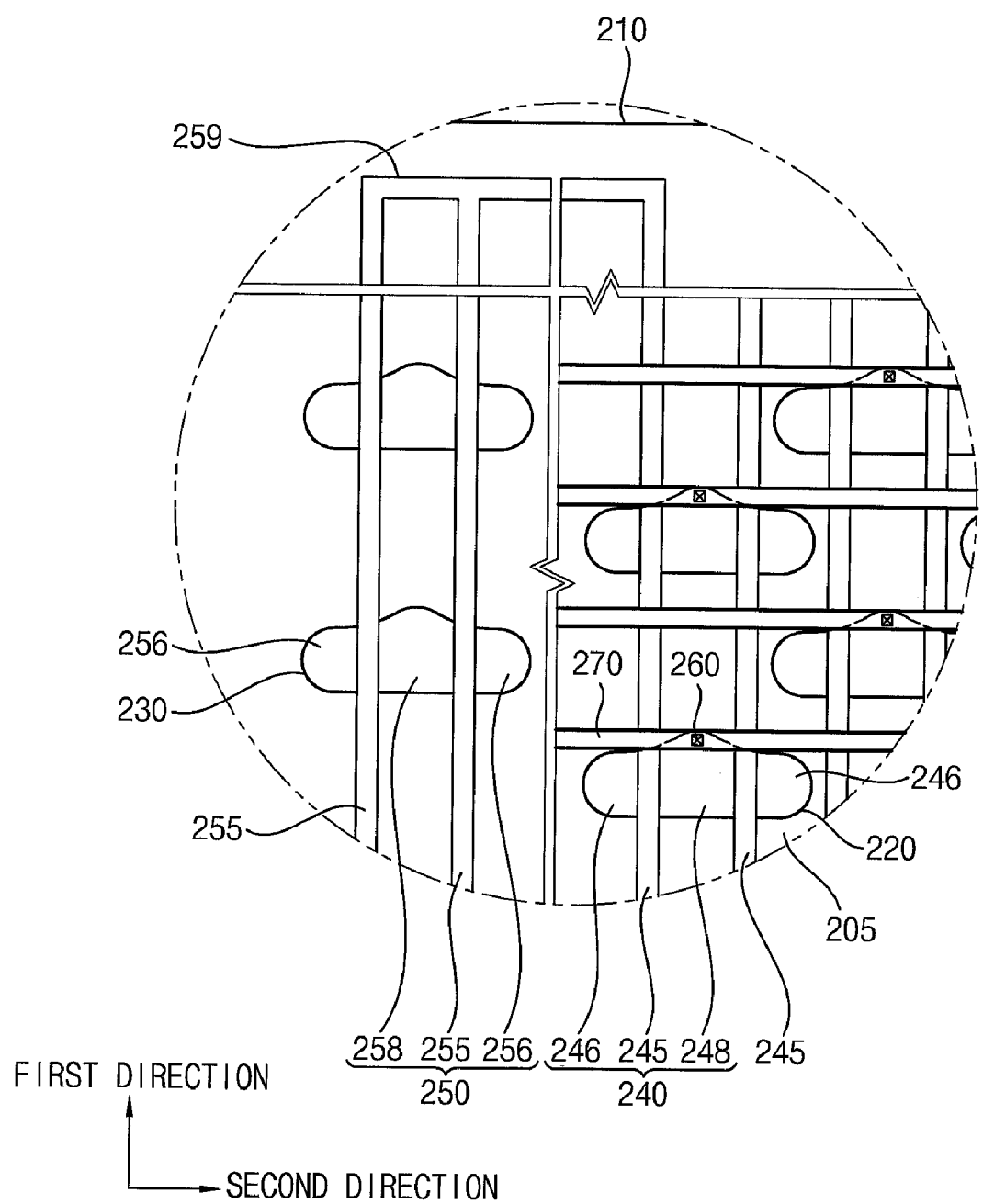

FIGS. 6A to 6C are top views for use in explaining a method of manufacturing a semiconductor device in accordance with some example embodiments of the present invention. Although a method of forming the semiconductor device of FIG. 5 is illustrated in FIGS. 6A to 6C, the scope of the present embodiment is not limited to the method of forming the semiconductor device of FIG. 5.

Referring to FIG. 6A, an isolation layer 205 is formed on a net die region 210 of a substrate (not shown) to define a first active region 220 and a second active region 230. The isolation layer 205 may be formed by a STI process or a LOCOS process.

In an example embodiment of the present invention, a plurality of the first active regions 220 is formed to constitute an active region array. One or more than one second active regions 230 may be formed.

Referring to FIG. 6B, a transistor 240 and a dummy transistor 250 are formed on the first active region 220 and the second active region 230, respectively.

In particular, an insulation layer (not shown) is formed on the net die region 210. The insulation layer may be formed using an oxide, a nitride and/or an oxynitride. As examples, the insulation layer may be formed by a CVD process, a LPCVD process, a PECVD process, or an HDP-CVD process.

A first conductive layer may be formed using doped polysilicon, a metal and/or a metal silicide. As examples, the first conductive layer may be formed by a CVD process, an ALD process, or an HDP-CVD process.

After forming a photoresist pattern (not shown) on the first conductive layer, the first conductive layer and the insulation layer are partially removed by an etching process using the photoresist pattern as an etching mask, thereby forming a gate line 245, a dummy gate line 255 and a conductive line 259. The gate line 245 includes a gate insulation layer (not shown), a gate electrode (not shown), and the dummy gate line 255 includes a dummy gate insulation layer (not shown) and a dummy gate electrode (not shown).

In an example embodiment of the present invention, a plurality of the gate lines 245 is formed. In this case, each of the gate lines 245 extends in a first direction, and the gate lines 245 are disposed at a given distance from each other in a second direction which is substantially perpendicular to the first direction. One or more than one dummy gate lines 255 may be formed. The dummy gate line 255 is electrically connected to the gate line 245 by the conductive line 259. In an example embodiment of the present invention, the dummy gate line 255 extends in the first direction, and two dummy gate lines 255 are formed on one second active region 230. The dummy gate lines 255 may be electrically connected to each other by the conductive line 259.

Impurities are implanted onto the first and second active regions 220 and 230 by an ion implantation process. Accordingly, a first source region 246 and a first drain region 248 are formed at upper portions of the first active region 220 adjacent to the first gate line 245, and a second source region 256 and a second drain region 248 are formed at upper portions of the second active region 230 adjacent to the dummy gate line 255. The gate line 245, the first source region 246 and the first drain region 248 constitute the transistor 240, and the dummy gate line 255, the second source region 256 and the second drain region 258 constitute the dummy transistor 250.

Referring to FIG. 6C, an insulating interlayer (not shown) is formed on the net die region 210 to cover the transistor 240, the dummy transistor 250 and the conductive line 259. The insulating interlayer may be formed using an oxide, a nitride and/or an oxynitride. As examples, the insulating interlayer may be formed by a CVD process, a LPCVD process, a PECVD process, or an HDP-CVD process.

A plug 260 is formed on the first drain region through the insulating interlayer.

In particularly, openings (not shown) are formed on the insulating interlayer to partially expose the first drain region 248. A second conductive line is formed on the insulating interlayer to fill up the openings. As examples, the second conductive line may be formed by a CVD process, an ALD process, or an HDP-CVD process, using a metal and/or a metal nitride. An upper portion of the second conductive layer on the insulating interlayer is removed by a CMP process and/or an etch-back process, thereby forming the plug 260 electrically connected to the first drain region 248. A plurality of the plugs 260 is formed in accordance with the number of the drain region 248.

A bit line 270 is formed to be electrically connected to the first drain region 248.

In particular, a third conductive layer is formed on the insulating interlayer and the plug 260. As examples, the third conductive layer may be formed by a CVD process, an ALD process, or an HDP-CVD process, using a metal and/or a metal nitride. The third conductive layer is patterned by a photolithography process using a photoresist pattern, thereby forming the bit line 270 electrically connected to the plug 260. In an example embodiment of the present invention, the bit line 270 is formed to extend in the second direction.

Capacitors (not shown) may be formed over the bit line 270 and the insulating interlayer to be electrically connected to the first source region 246, and other wirings and elements may also be formed.

According to some example embodiments of the present invention, in a method of forming a test structure of a semiconductor device, plasma used in formation of various patterns does damage not only to a transistor of the semiconductor device but also to a dummy transistor, and thus plasma damage to the transistor may be dispersed into the dummy transistor and relatively reduced. Accordingly, the characteristics of the transistor, such as a threshold voltage, may be measured more exactly using the test structure.

Additionally, a semiconductor device in accordance with some example embodiments of the present invention includes not only a transistor serving as a switching element, but also a dummy transistor which reduces plasma damage to the transistor. Thus, the semiconductor device including the transistor may exhibit a favorable reliability and favorable electrical characteristics.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A test structure of a semiconductor device, comprising:
a transistor on a first active region of a substrate, the transistor including a first gate line;
a dummy transistor on a second active region of the substrate, the dummy transistor including a dummy gate line;
a conductive line contacting the first gate line and the dummy gate line; and
a pad unit electrically connected to the transistor,
wherein the conductive line, the first gate line and the dummy gate line are on a same plane.

2. The test structure of claim 1, wherein a plurality of dummy transistors is formed on the second active region.

3. The test structure of claim 1, wherein the first gate line extends in a first direction, and wherein the test structure further comprises a second gate line which extends in the first direction.

4. The test structure of claim 3, wherein the second gate line is electrically connected to the first gate line.

5. The test structure of claim 1, wherein the first gate line extends in a first direction, and wherein the test structure further comprises a plurality of second gate lines each extending in the first direction, wherein the second gate lines are spaced apart from each other in a second direction which is substantially perpendicular to the first direction.

6. The test structure of claim 1, comprising a plurality of the transistors.

7. The test structure of claim 1, wherein the transistor further includes a gate line, a source region and a drain region formed at upper portions of the first active region adjacent to the first gate line,
wherein the substrate further includes a third active region including a well region, and
wherein the pad unit includes a gate pad, a source pad, a drain pad and a bulk pad electrically connected to the first gate line, the source region, the drain region and the well region, respectively.

8. The test structure of claim 1, wherein plasma damages to the transistor is reduced due to the dummy transistor.

9. The semiconductor device of claim 1, wherein the same plane is parallel to an upper surface of an underlying substrate.

10. A semiconductor device comprising:
a transistor on a first active region of a substrate, the transistor including a first gate line;
a dummy transistor on a second active region of the substrate, the dummy transistor including a dummy gate line; and
a conductive line contacting the first gate line and the dummy gate line,
wherein the conductive line, the first gate line and the dummy gate line are on a same plane.

11. The semiconductor device of claim 10, comprising a plurality of dummy transistors.

12. The semiconductor device of claim 10, wherein plasma damage to the transistor is reduced by the dummy transistor.

13. The semiconductor device of claim 10, wherein the same plane is parallel to an upper surface of an underlying substrate.

* * * * *